United States Patent
Dohner et al.

(10) Patent No.: US 11,777,059 B2
(45) Date of Patent: Oct. 3, 2023

(54) PIXELATED LIGHT-EMITTING DIODE FOR SELF-ALIGNED PHOTORESIST PATTERNING

(71) Applicant: Lumileds LLC, San Jose, CA (US)

(72) Inventors: Emma Dohner, Redwood City, CA (US); Kentaro Shimizu, Sunnyvale, CA (US)

(73) Assignee: Lumileds LLC, San Jose, CA (US)

( * ) Notice: Subject to any disclaimer, the term of this patent is extended or adjusted under 35 U.S.C. 154(b) by 393 days.

(21) Appl. No.: 17/084,999

(22) Filed: Oct. 30, 2020

(65) Prior Publication Data

US 2021/0151626 A1    May 20, 2021

Related U.S. Application Data (60) Provisional application No. 62/938,001, filed on Nov. 20, 2019.

(51) Int. Cl.
| | |
|---|---|
| *H01L 33/00* | (2010.01) |
| *H01L 33/32* | (2010.01) |
| *H01L 33/50* | (2010.01) |
| *H01L 27/15* | (2006.01) |

(52) U.S. Cl.
CPC ............ *H01L 33/32* (2013.01); *H01L 27/156* (2013.01); *H01L 33/007* (2013.01); *H01L 33/502* (2013.01)

(58) Field of Classification Search
None
See application file for complete search history.

(56) References Cited

U.S. PATENT DOCUMENTS

| | | | |
|---|---|---|---|
| 3,698,396 A | 10/1972 | Katerndahl et al. | |
| 6,504,180 B1 * | 1/2003 | Heremans | H01L 33/025 |
| | | | 257/E33.068 |
| 6,756,186 B2 | 6/2004 | Collins, III et al. | |
| 8,222,811 B2 | 7/2012 | Vaufrey et al. | |
| 8,258,044 B2 | 9/2012 | Brun et al. | |
| 8,487,340 B2 | 7/2013 | Gilet et al. | |
| 8,638,032 B2 | 1/2014 | Maindron et al. | |
| 8,647,957 B2 | 2/2014 | Borowik et al. | |
| 8,697,548 B2 | 4/2014 | Borowik et al. | |
| 8,890,111 B2 | 11/2014 | Templier et al. | |
| 9,093,607 B2 | 7/2015 | Gilet et al. | |
| 9,109,296 B2 | 8/2015 | Metaye et al. | |

(Continued)

FOREIGN PATENT DOCUMENTS

| | | |
|---|---|---|
| CA | 2984214 A1 | 4/2019 |
| CA | 2986412 A1 | 5/2019 |

(Continued)

OTHER PUBLICATIONS

European Search Report dated Jul. 29, 2020 from European Application No. 20154542.3, 8 pages.

(Continued)

*Primary Examiner* — Bradley Smith
(74) *Attorney, Agent, or Firm* — Servilla Whitney LLC (57) ABSTRACT

A light source includes an array of light emitters, with at least some light emitters having a central patterned surface and an unpatterned border; a light blocking metal layer positioned between each of the array of light emitters; and down-converter material positioned on each of the array of light emitters.

18 Claims, 9 Drawing Sheets

(56) References Cited

U.S. PATENT DOCUMENTS

| | | |
|---|---|---|
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,601,542 B2 | 3/2017 | Robin et al. |
| 9,768,350 B2 | 9/2017 | Bavencove et al. |
| 10,304,364 B2 | 5/2019 | Chaji |
| 10,312,224 B2 | 6/2019 | Edmond et al. |
| 10,535,546 B2 | 1/2020 | Chaji |
| 10,700,120 B2 | 6/2020 | Chaji et al. |
| 10,707,277 B2 | 7/2020 | Chaji et al. |
| 2002/0106847 A1 | 8/2002 | Kazlas et al. |
| 2003/0181122 A1 | 9/2003 | Collins, III et al. |
| 2006/0281203 A1 | 12/2006 | Epler et al. |
| 2011/0151607 A1 | 6/2011 | Andis et al. |
| 2011/0287606 A1 | 11/2011 | Brun et al. |
| 2012/0205614 A1 | 8/2012 | Templier et al. |
| 2013/0020115 A1 | 1/2013 | Mataye et al. |
| 2013/0112945 A1 | 5/2013 | Gilet et al. |
| 2014/0077156 A1 | 3/2014 | Bavencove et al. |
| 2014/0138719 A1 | 5/2014 | Maindron et al. |
| 2015/0118544 A1 | 4/2015 | Oukassi |
| 2015/0144590 A1 | 5/2015 | Simonato et al. |
| 2015/0280060 A1 | 10/2015 | Gilet et al. |
| 2015/0380461 A1 | 12/2015 | Robin et al. |
| 2016/0079565 A1 | 3/2016 | Maindron et al. |
| 2016/0218240 A1 | 7/2016 | Bouvier et al. |
| 2017/0080457 A1 | 3/2017 | Eymery et al. |
| 2017/0137645 A1 | 5/2017 | Manceau et al. |
| 2017/0149019 A1 | 5/2017 | Smith et al. |
| 2017/0186612 A1 | 6/2017 | Almadori et al. |
| 2017/0186907 A1 | 6/2017 | Chaji et al. |
| 2017/0215280 A1 | 7/2017 | Chaji |
| 2017/0270231 A1 | 9/2017 | Chaji |
| 2018/0017939 A1 | 1/2018 | Allier et al. |
| 2018/0102449 A1 | 4/2018 | Pschenitzka et al. |
| 2018/0095124 A1 | 5/2018 | Chaji et al. |
| 2018/0097037 A1 | 5/2018 | Chaji et al. |
| 2018/0151804 A1 | 5/2018 | Chaji et al. |
| 2018/0166424 A1 | 6/2018 | Sim et al. |
| 2018/0287027 A1 | 10/2018 | Chaji |
| 2018/0358404 A1 | 12/2018 | Chaji et al. |
| 2018/0358405 A1 | 12/2018 | Chaji et al. |
| 2019/0080970 A1 | 3/2019 | Chaji |
| 2019/0096774 A1 | 3/2019 | Chaji |
| 2019/0097179 A1 | 3/2019 | Shu et al. |
| 2019/0123033 A1 | 4/2019 | Martin |
| 2019/0146626 A1 | 5/2019 | Chaji et al. |
| 2019/0148321 A1 | 5/2019 | Chaji et al. |
| 2019/0181181 A1* | 6/2019 | Yeon ................ H01L 33/22 |
| 2019/0242550 A1* | 8/2019 | Mercado Peña ...... F21S 43/315 |
| 2019/0288156 A1 | 9/2019 | Chaji et al. |
| 2019/0371868 A1 | 12/2019 | Chaji et al. |
| 2020/0013662 A1 | 1/2020 | Chaji et al. |
| 2020/0013761 A1 | 1/2020 | Chaji et al. |
| 2020/0091388 A1 | 3/2020 | Chaji et al. |
| 2020/0161290 A1 | 5/2020 | Chaji et al. |
| 2020/0203579 A1 | 6/2020 | Roitman et al. |
| 2020/0212270 A1 | 7/2020 | Bohmer et al. |
| 2020/0273945 A1 | 8/2020 | Chaji et al. |

FOREIGN PATENT DOCUMENTS

| | | |
|---|---|---|
| DE | 102019101489 A1 | 5/2019 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| TW | I408839 B | 9/2013 |
| TW | I485877 B | 5/2015 |
| TW | 201622187 A | 6/2016 |
| TW | I556684 B | 11/2016 |
| TW | I575790 B | 3/2017 |
| TW | I636584 B | 9/2018 |
| TW | 201946313 A | 12/2019 |
| WO | 97/48138 A2 | 12/1997 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |
| WO | 2013182969 A1 | 12/2013 |
| WO | 2014150263 A1 | 9/2014 |
| WO | 2015044620 A1 | 4/2015 |
| WO | 2017089676 A1 | 6/2017 |
| WO | 2017149521 A1 | 9/2017 |
| WO | 2017216445 A1 | 12/2017 |
| WO | 2020100127 A1 | 5/2020 |
| WO | 2020170201 A1 | 8/2020 |
| WO | 2020170214 A1 | 8/2020 |
| WO | 2020170219 A1 | 8/2020 |

OTHER PUBLICATIONS

PCT International Search Report and Written Opinion in PCT/US2020/059938 dated Feb. 19, 2021, 13 pages.

* cited by examiner

PIXELATED LIGHT-EMITTING DIODE FOR SELF-ALIGNED PHOTORESIST PATTERNING

CROSS-REFERENCE TO RELATED APPLICATIONS

This application claims priority to U.S. Provisional Application No. 62/938,001, filed Nov. 20, 2019, the entire disclosure of which is hereby incorporated by reference herein.

TECHNICAL FIELD

The present disclosure relates generally to micro-light emitting diode (LED) lighting systems. In certain embodiments, self-aligned photoresist patterning is used to create features that reduce optical crosstalk between LED pixels.

BACKGROUND

Light emitting diodes (LEDs) have been widely for vehicular headlamps, roadway illumination, light fixtures, and various applications requiring high luminous efficacy, long lifetime, and good controllability of light direction and intensity. In some applications, lighting can be improved or new lighting applications enabled by providing an LED light source that includes multiple pixels that can be adaptively programmed to emit light of defined intensity. Such LED pixel arrays can often benefit from smaller pixel sizes, larger numbers of pixels, and greater pixel density.

High-intensity/brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a growth substrate such as a sapphire, silicon carbide, III-nitride, or other suitable substrate by metal-organic chemical vapor deposition (MOCVD), molecular beam epitaxy (MBE), or other epitaxial techniques. Sapphire is often used as the growth substrate due to its wide commercial availability and relative ease of use. The stack grown on the growth substrate typically includes one or more n-type layers doped with, for example, Si, formed over the substrate, a light emitting or active region formed over the n-type layer or layers, and one or more p-type layers doped with, for example, Mg, formed over the active region.

Unfortunately, simply decreasing pixel size and increasing pixel density can lead to problems. Since light from an LED and an associated phosphor is emitted in all directions, it can be difficult to prevent light emissions of one LED pixel from overlapping light emissions of another LED pixel of a pixel array, decreasing the effective resolution of the LED pixel array or causing unwanted pixel lighting overlap of illuminated areas. This is particularly true for designs that have separate LED light emitters in a pixel array but still use a single phosphor layer.

One solution to minimizing optical crosstalk between LED pixels in a pixel array is to have multiple separated phosphors, each associated with discrete pixels by using conventional photoresist patterning and phosphor deposition. Unfortunately, when considering wafer scale processing of LED pixel arrays and accuracy limitations of die-to-wafer attach, each LED die will have a slightly different orientation on a wafer. For small and high density micro-LED arrays, this die-to-die variation may be comparable to the critical dimensions of the photoresist pattern. Accurately aligning a mask to each die is time-consuming, increases cost, and reduces the advantage of parallel wafer level processing.

SUMMARY

Provided herein are light sources and methods of making them. Light emitters, e.g., pixels, comprise central patterned surfaces and an unpatterned borders to facilitate self-aligned maskless methods of making light sources.

In a first aspect, a light source comprises an array comprising: a plurality of light emitters. Each light emitter comprises a semiconductor layer having first and second surfaces. The semiconductor layer may comprise a III-nitride material. In one or more embodiments, the semiconductor layer comprises GaN. In one or more embodiments, the semiconductor layer comprises a stack of layers including an n-type layer, a light emitting region, and a p-type layer. The first surfaces of at least a portion of the light emitters comprising: a central patterned surface and an unpatterned border. In one or more embodiments, the unpatterned border has a width in a range of 1 to 50 microns. Each light emitter further comprises a down-converter material, for example a phosphor material, on the semiconductor layer. The array further comprises light blocking metal positioned between each of the light emitters and down-converter material positioned on each of the array of light emitters. The down-converter material, e.g., phosphor layers, can be positioned within self-aligned cavities defined in part by emission of light from at least some of the array of light emitters into a positive photoresist and removal of exposed photoresist. In an embodiment, there is a presence of the down-converter material on the central pattered surface, and an absence of the down-converter material on at least portions of the unpatterned border.

In one embodiment, each of the light emitters comprises a minimum width in a range of 5 microns and 500 microns. The light emitters can be formed from at least partially roughened or patterned GaN formed by direct etching or growth on a previously patterned and removal sapphire or other substrate. In one or more embodiments, light emitting material comprises GaN.

In one embodiment, each of the light emitters can support a light blocking metal layer having a height of less than 5 microns. In some embodiments, the light blocking layer can be electroplated aluminum or other reflective metal. Metal deposition can occur both before or after deposition of down-converter material, e.g., phosphor material, on discrete pixels of the light emitter array.

In one embodiment, the array includes common electrical contacts active at wafer or die level. Selected or all of the array of light emitters can be provided with electrical current to generate and emit light that develops portions of a positive photoresist layer.

In one embodiment, the array provides multicolor lighting and can be color tunable by selective activation and/or current levels provided to pixels in the array.

In one embodiment, phosphors are formed from particles bound together by a condensation cure silicone system.

In one embodiment, optical elements are aligned with at least some of the array of light emitters. In addition to optical elements such as lenses, beam spreaders, beam homogenizers, polarizing or color filters, and light scattering layers, various protective layers can also be applied. In some embodiments, active optical or electrical layers including ITO, graphene, or other conductive layers can be applied.

In one embodiment the light source can be used for at least one of architectural, camera flash, and automotive lighting.

In a further aspect, a method of manufacturing a light source by a self-aligned maskless method comprises: coating an array of light emitters with a positive photoresist. The array of light emitters may be provided by a die or wafer level substrate. At least some of the light emitters can be activated to expose portions of the positive photoresist and create developed positive photoresist. After washing away the developed positive photoresist, cavities are within positive (undeveloped) photoresist sidewalls. A down-converter material, e.g., a phosphor material, or other suitable material can be used to at least partially fill the cavities.

In one embodiment, further processing can include depositing and washing away a second positive photoresist layer. Advantageously, this allows build up of a various phosphor material layer stacks.

In another embodiment, processing can include electroplating metal on a bonding metal layer deposited in GaN trenches. This allows increasing height of reflective sidewalls, reducing potential optical crosstalk between adjacent light emitters.

In another embodiment, electrical contacts on a reverse side of a wafer are supplied with current to activate the array of light emitters. Activation can define a desired pattern, which can include, but is not limited to checkerboard or RGBY consistent patterns.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The line drawings of FIGS. 1-3 and 5-6 are not to scale.

FIGS. 2A-2E.2 illustrate a self-aligned process suitable for applying and patterning photoresist to a structure such as illustrated with respect to FIG. 1;

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AN, InN and alloys), metal alloys, and other conductive materials, depending on the application. Substrates include, without limitation, light emitting diode (LED) devices, including uLED devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Reference to a micro-LED (uLED) means a light emitting diode having one or more characteristic dimensions (e.g., height, width, depth, thickness, etc. dimensions) of less than 100 micrometers. In one or embodiments, one or more dimensions of height, width, depth, thickness have values in a range of 2 to 25 micrometers.

A down-converter material absorbs energy, converting an entering wavelength to a lower-energy higher wavelength. Herein, the down-converter material may be a phosphor material, or semiconductor nanoparticles (quantum dots), or a combination of phosphor and quantum dots.

Reference to an absence of a material, e.g., down-converter material, on at least portions of the unpatterned border recognizes that during a deposition process, some material could bleed onto the unpatterned border. In one or more embodiments, there is an absence of the down-converter material on greater than or equal to 50% of the unpatterned border, or greater than or equal to 60%, or greater than or equal to 70%, or greater than or equal to 80%, or greater than or equal to 90%, or greater than or equal to 95%, or greater than or equal to 99%.

Methods of depositing thin films include but are not limited to: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof.

Figure 1:
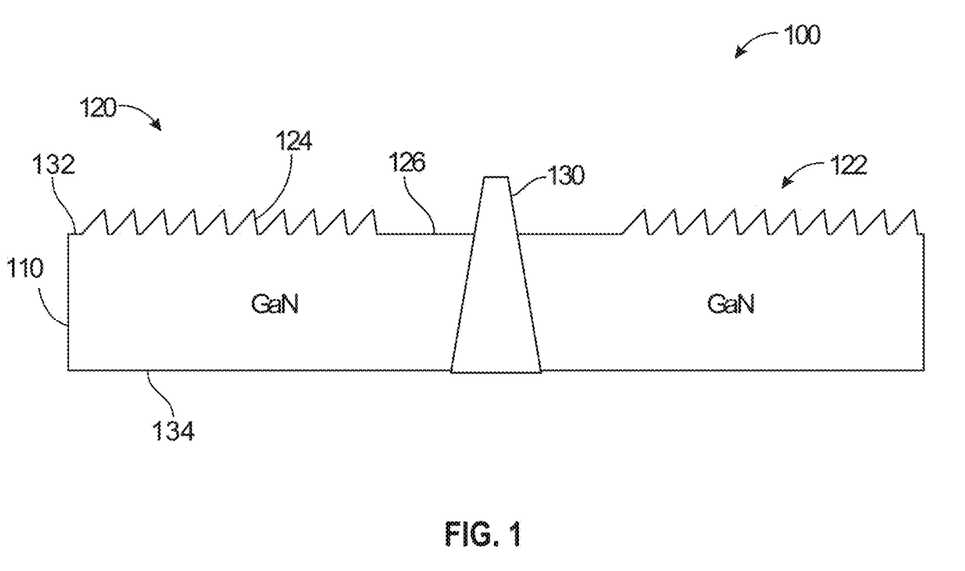
FIG. 1 is a schematic view illustrating in cross-section a portion of a pixel array formed at least in part from a GaN-based die or wafer.

FIG. 1 is a schematic view illustrating in cross-section a portion of a pixel array 100 comprising a plurality of light emitters, e.g. pixels. Two pixels (120 and 122) are partially shown in cross section. In FIG. 1, details are provided for pixel 120, and it is understood that pixel 122 has corresponding features. Each light emitter comprises a semiconductor layer 110 having a first surface 132 and a second surface 134. In one or more embodiments, the semiconductor layer comprises GaN. In one or more embodiments, the semiconductor layer comprises a stack of layers including an n-type layer, a light emitting region, and a p-type layer. The array may be formed at least in part by patterning an underlying die or wafer, which may include: a plurality of individual pixels including at least: a semiconductor layer and contacts that can be electrically addressed to emit light. Each pixel comprises a central patterned surface 124 and an unpatterned border 126. The plurality of pixels 120 and 122 is separated by a trench or a groove filled with a light blocking metal 130 or other suitable structure able to absorb or reflect overlapping light emissions from adjacent LED pixels. The unpatterned border is designed to minimize lateral emission from each pixel.

In some embodiments, electroplating of the die or wafer starts with a seed layer followed by photoresist pattern to outline metal pad growth areas. Alternatively, existing metal structures can be electroplated after laser lift-off of the sapphire layer. The metal electroplating can be limited to less than 5 microns in height to reduce the spreading of the electroplated material into the active GaN pixel area. Metallization and contact pattern of die or wafer can be designed such that specific subsets of pixels can be electrically contacted at the wafer or tile level. Common contacts can later be severed to allow for individual addressability of all pixels.

Figure 2A:
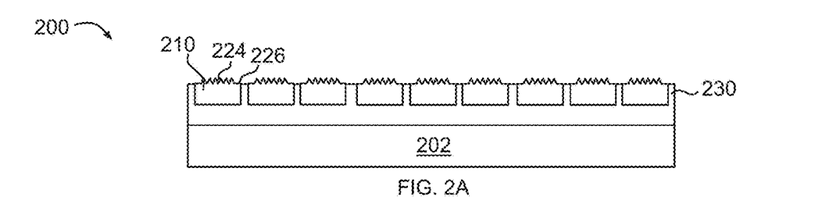
Figure 2B:
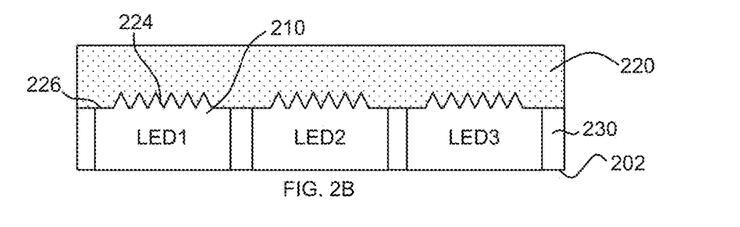

FIGS. 2A-2E illustrate a self-aligned process 200 suitable for applying and patterning photoresist to a structure such as illustrated with respect to FIG. 1. To begin, FIG. 2A shows a die or wafer 202 including a plurality of individual pixels 210 each having a central patterned surface 224 and an unpatterned border 226 and being separated by a light blocking metal 230. The pixels each comprise a semiconductor layer. Shown in FIG. 2B is a close-up excerpt of three pixels (LED1, LED2, and LED3) from FIG. 2A, where a layer of positive photoresist 220 is deposited onto top surfaces of the die or wafer 202, above the patterned surfaces of the "LED"s 224 and their unpatterned borders 226 and the light blocking metal 230.

Figure 2C:
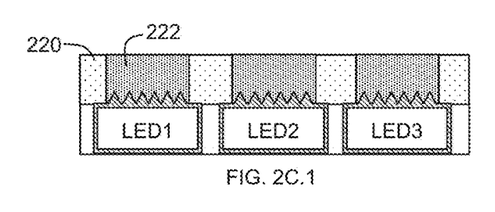
Figure 2C:
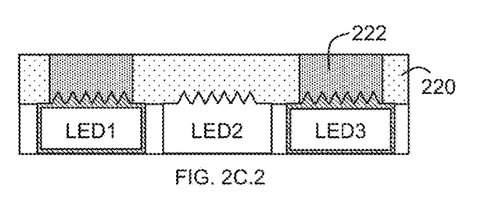
Figure 2D:
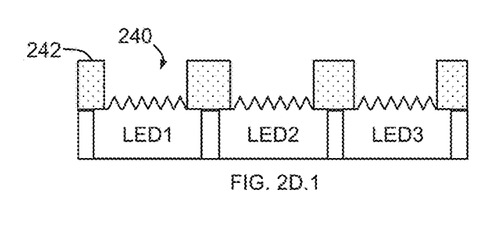
Figure 2D:
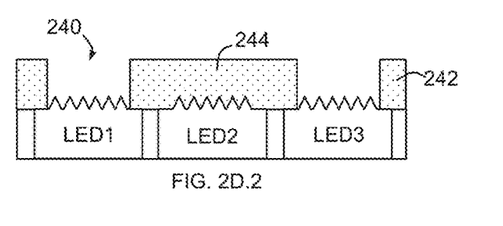
Figure 2E:
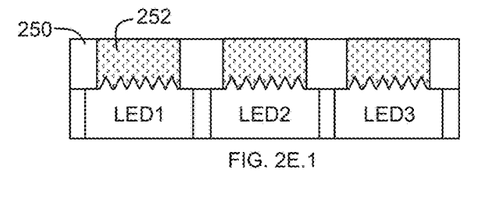

At this point, two options are presented with respect to illuminating pixels to allow for creating designs for desired applications. In a first option at FIG. 2C.1, all pixels, e.g., LED1, LED2, and LED3, are illuminated, which develops positive photoresist into developed positive photoresist 222 above only the patterned surfaces of each pixel (LED1, LED2, and LED3). Positive (undeveloped) photoresist 220 resides on the unpatterned borders and the light blocking metal. In a second option at FIG. 2C.2, only some pixels are illuminated, e.g., LED1 and LED3 forming a defined pattern of developed photoresist 222. The pixels are illuminated for a duration. In one or more embodiments, the duration is greater than one second and less than ten seconds. Positive photoresist is developed by suitable methods including flooding with developer and drying. Illumination, addition of developer, and drying is repeated as needed.

Thereafter at FIGS. 2D.1 and 2D.2, the developed positive photoresist portions (i.e. those exposed to light from patterned surfaces of the lit pixels) are washed away. This leaves a cavity 240 separated by a thin edge wall 242 or thick edge wall 244 of the positive (undeveloped) photoresist. The cavity 240 can be further processed by infill or addition of a down-converter material, for example, a phosphor material. In FIGS. 2E.1 and 2E.2, the cavity 240 is filled with a down-converter material 252, according to desired configurations. Thereafter, remaining photoresist 220 is removed. and additional processing using to fill open cavities with metal sidewalls 250 or further down-converter material 252. There is a presence of the down-converter material on the central pattered surface, and an absence of the down-converter material on at least portions of the unpatterned border.

Figure 2E:
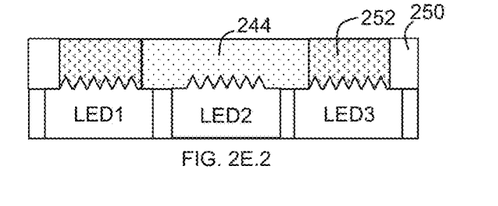

For FIG. 2E.2, further processing is possible to develop the positive resist of thick edge wall 244 by illuminating pixel LED2, removing the developed photoresist, and depositing a desired down-converter material on LED2.

Figure 3A:
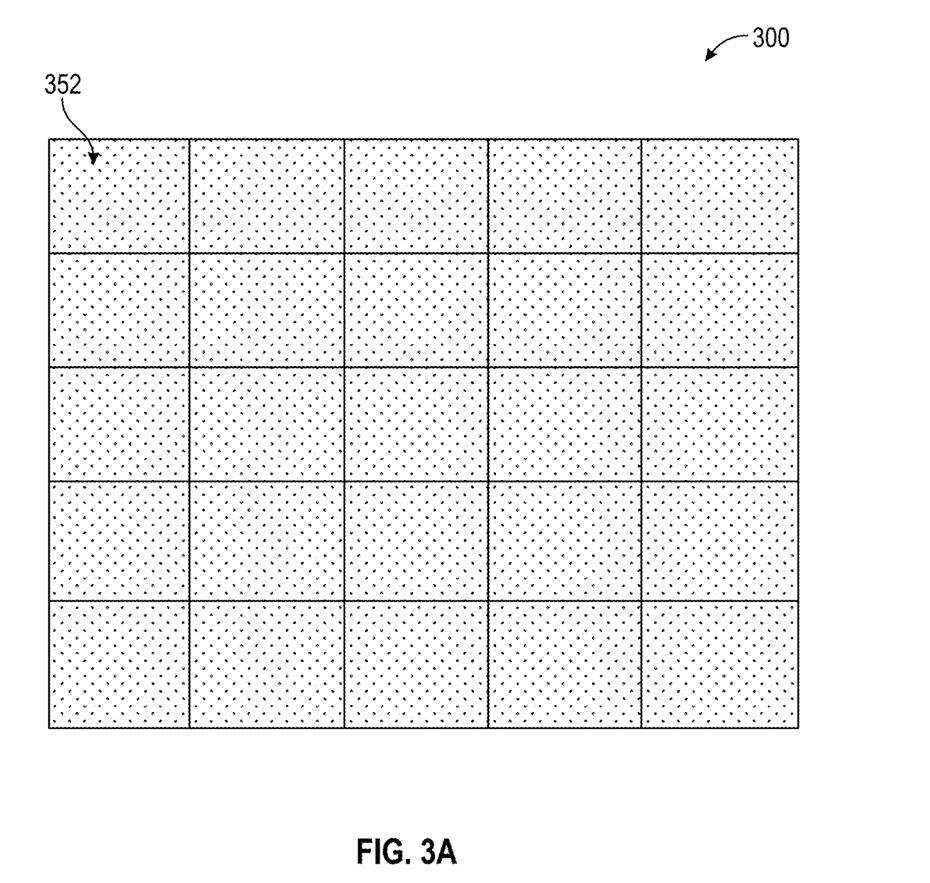
FIG. 3A illustrates an embodiment of a pixel array topped with a first phosphor material 352 after processing in which all pixels in the pixel array are illuminated.
Figure 3B:
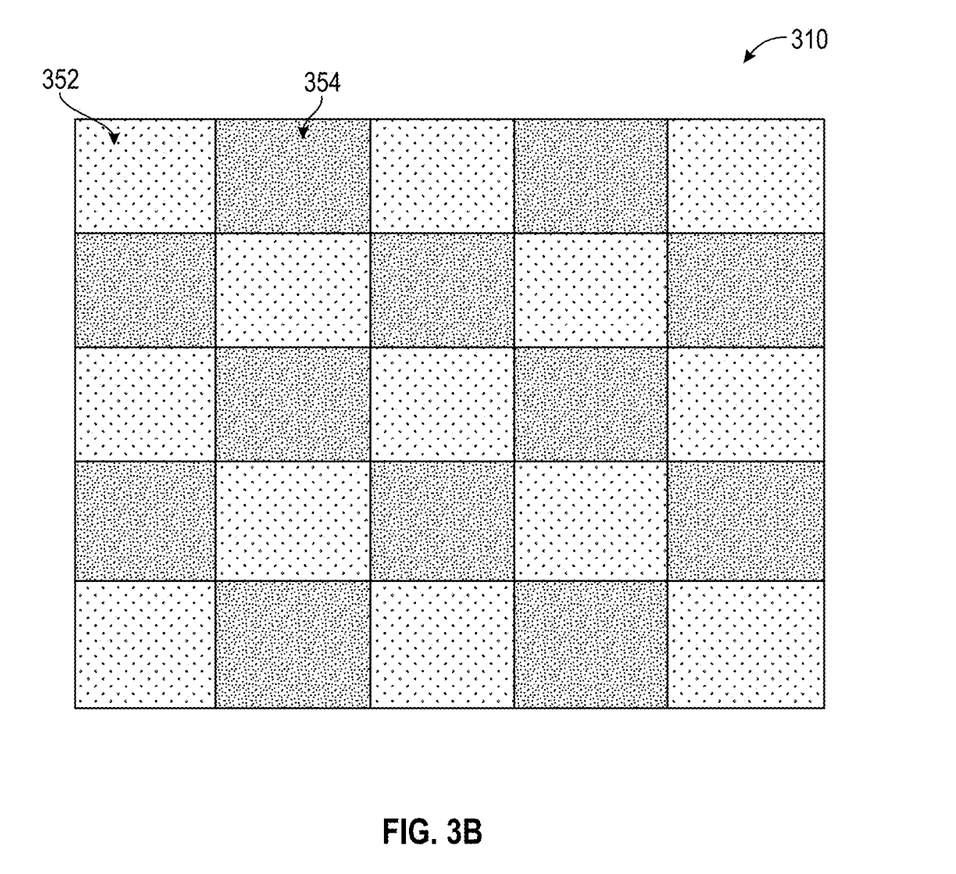
FIG. 3B illustrates another embodiment of a pixel array 310 topped with both a first phosphor material 352 and a second phosphor material 354.

FIG. 3A illustrates a pixel array 300 topped with a first phosphor material 352 after processing in which all pixels in the pixel array are illuminated. Alternatively, FIG. 3B illustrates a pixel array 310 topped with both a first phosphor material 352 and a second phosphor material 354 after processing in which half of the pixels in the pixel array are illuminated in a checkerboard pattern. After developing and washing the photoresist, any cavities are filled with the first phosphor material. Any previously unilluminated pixels are lit, the photoresist developed and washed, and any cavities filled with the second phosphor material are used to define the checkerboard or other desired pattern.

Figure 4A:
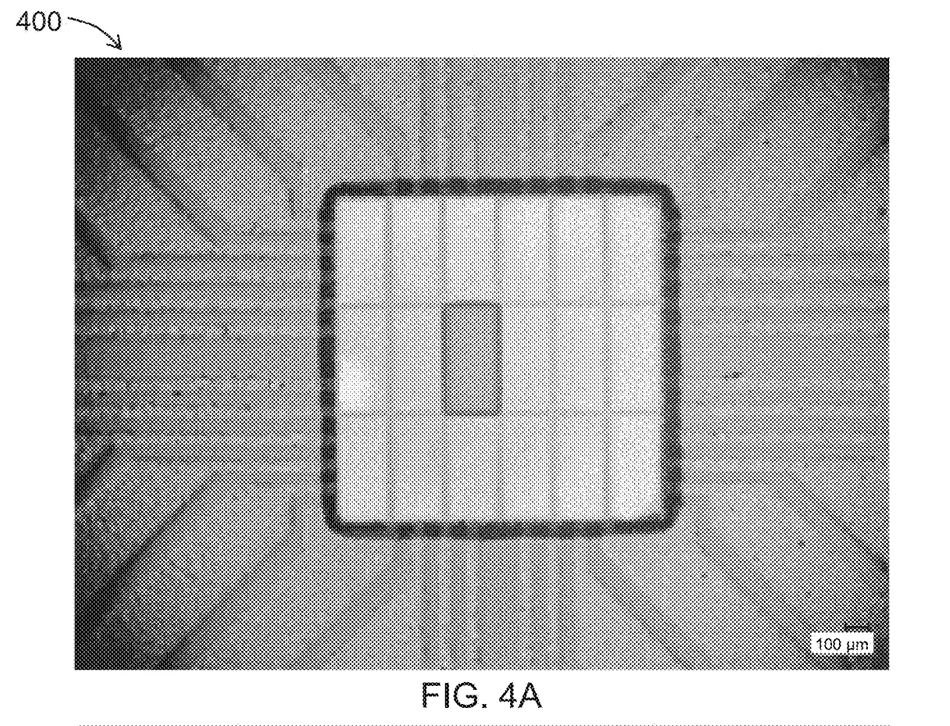
FIGS. 4A, 4B, and 4C respectively show microscopic images of an LED pixel array processed according to one embodiment.
Figure 4B:
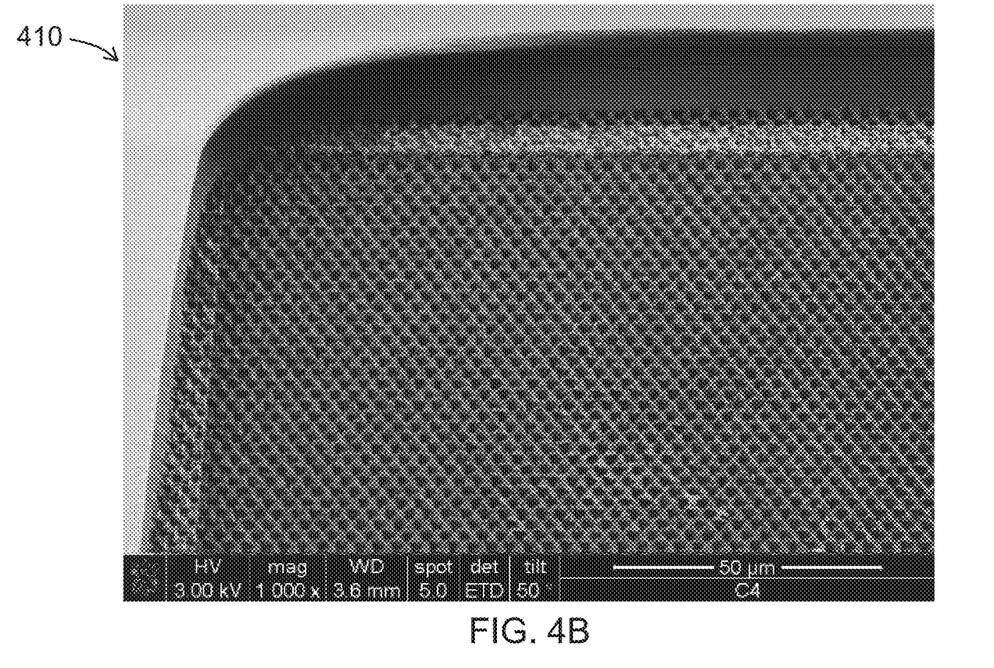
Figure 4C:
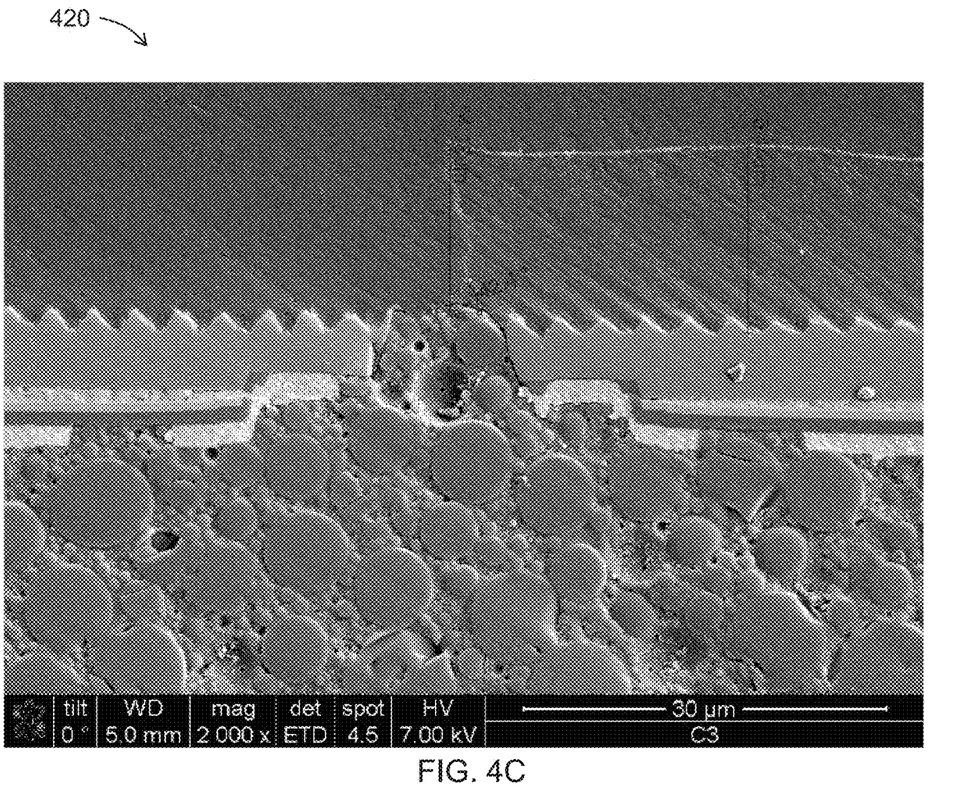

FIGS. 4A, 4B, and 4C respectively show images of an LED pixel array processed according to one embodiment. A 6×3 array of blue-emitting LEDs on a ceramic tile was coated with the adhesion promoter hexamethyldisilazane (HMDS). A 15 micron layer of the positive photoresist AZ4562 was spin-coated onto the tile, and subsequently dried at 100° C. for 2 minutes. Electrical contact was made to a single pixel of the array, which was then run at 800 mA/cm2 for 5 seconds. The photoresist was then flooded with the TMAH-based developer RD6 for 50 s, and then spun dry. This process was repeated, and the sample was then rinsed in DI water. FIG. 4A shows an optical image 400, having a scale of 100 μm, of the resulting photoresist pattern with photoresist removed from one of the center pixels. FIG. 4B shows a scanning electron microscope image 410 of a corner of the pattern, while FIG. 4C shows a scanning electron microscope image 420 of a cross-section of the same sample along an edge of a photoresist pattern between two neighboring LED pixels. Thickness of remaining photoresist was measured at two spots: 14.18 micrometers and 15.44 micrometers. The angle of undercut was 42.4°.

Figure 5:
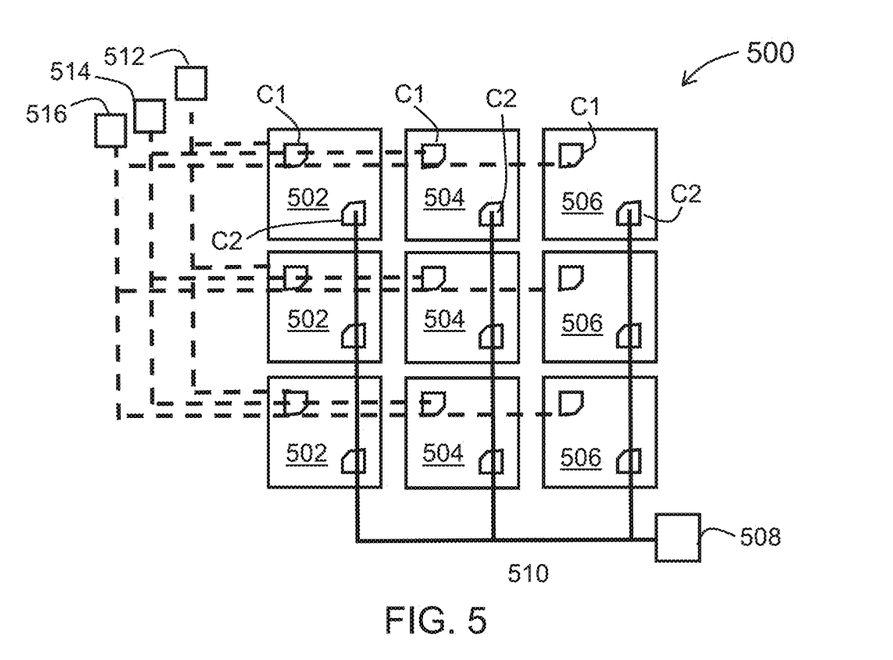
FIG. 5 illustrates an exemplary contact layout for making electrical contact to subsets of pixels at the wafer level for photoresist exposure.

FIG. 5 illustrates an exemplary contact layout 500 for making electrical contact to subsets of pixels at the wafer level for photoresist exposure. A subset of pixels 502 of a first color, for example red, is electrically connected between a first contact "C1" of each 502 to a first-color common contact 512. A second contact "C2" of each 502 is in electrical contact with connection 510 to a layout common contact 508. A subset of pixels 504 of a second color, for example green, is electrically connected between a first contact "C1" of each 504 to a second-color common contact 514. A second contact "E2" of each 504 is in electrical contact with connection 510 to the layout common contact 508. A subset of pixels 506 of a third color, for example blue, is electrically connected between a first contact "C1" of each 506 to a third-color common contact 516. A second contact "C2" of each 506 is in electrical contact with connection 510 to the layout common contact 508. Common contacts can be later severed to allow for individual addressability of all pixels.

Advantageously, LED pixels containing a central patterned surface and an unpatterned border will minimize lateral emission from each pixel so that a photoresist film on the die or wafer surface can be patterned with high resolution. In one or more embodiments, a width of the unpatterned border is in a range of 1 to 50 micrometers, including all values and subranges therebetween, including 5 to 20 microns. To enhance the extraction of light, the GaN surface in the semiconductor device have a roughened surface either by patterned sapphire from resist patterned etching or by a photo-electrochemical etch. In one embodiment, patterned sapphire can be formed to leave the sapphire smooth near the edge of the die layout. This requires alignment of the sapphire to the LED. The lack of surface roughness at the outer 5 to 20 micron edge of each pixel in the LED reduces the light intensity at the edge of the pixel and improved quality of the blue light extinction to reduce cross-talk between LED pixels.

In one embodiment, forming the self-aligned photoresist array can rely on deposition or coating of a uniform layer of positive photoresist sensitive to the LED's emission wavelength. When some or all of the LED pixels are then turned on, only the photoresist directly above the LED will be exposed. After developing, photoresist remains only on the dark areas of the array ("off" pixels, spaces between pixels), as well as around the border of the array. If the resulting pattern is filled with phosphor, the photoresist can then be stripped to yield a pixelated phosphor array aligned with the LED array. The photoresist thickness and LED light dosage can be tuned to minimize the over exposure in the areas of interest. Alternatively, a multi-step approach can be applied where a thin photoresist film is followed by the LED exposure and then a thin light blocking layer (such as aluminum metal) on the photoresist sidewall can be applied to further reduce the cross-talk from the LED light source. Any excess aluminum on the LED emitting surface can be removed by a directional dry etch process. A second photoresist layer can then be patterned with the aid of this blocking layer between pixels. This procedure can be repeated to create the desired photopatterned aspect ratio and sidewall profile.

Positive photoresist compounds useful for this described process can include photosensitive materials that are degraded by light so that a developer will dissolve away deposited regions that are exposed to light. In effect, this leaves behind a coating where a mask was placed (i.e. the film remains on the formerly dark portions of an illuminated resist). Positive resists typically need to be used at low temperatures, since they are susceptible to permanent cross-linking (also called "hard bake") at high temperatures, rendering the resist unable to be removed afterwards by the stripping bath (typically a mild solvent system).

The light emitting pixel arrays such as disclosed herein can include but are not limited to LEDs formed of sapphire or silicon carbide. The LEDs can be formed from an epitaxially grown or deposited semiconductor n-layer. A semiconductor p-layer can then be sequentially grown or deposited on the n-layer, forming an active region at the junction between layers. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials. In certain embodiment, laser light emitting elements can be used.

Color of emitted light from the LEDs can be modified using a phosphor particles that include one or more wavelength converting materials able to create white light or monochromatic light of other colors. In some embodiments, phosphor particles held together by adhesives or binders can be used. Phosphors bound together with silicone, for example, can be molded, dispensed, screen printed, sprayed, or laminated.

In one embodiment a condensation cure silicone system can be used to bind phosphor particles. Silicone material or siloxanes can be selected for mechanical stability, low temperature cure properties (e.g. below 150-120 degrees Celsius), and ability to be catalyzed using vapor phase catalysts. In one embodiment, organosiloxane block copolymers can be used. Organopolysiloxanes containing D and T units, where the D unit are primarily bonded together to form linear blocks having 10 to 400 D units and the T units are primarily bonded to each other to form branched polymeric chains, which are referred to as "non-linear blocks" can be used. In certain embodiments, the condensation cure silicone system can include optional organic, inorganic, or organic/inorganic binder and filler material. In one embodiment, light active phosphors, dyes, or nanoparticles can be bound together by the silicone. In other embodiments, the silicone can additionally form optical structures, including lenses, light guides, or refractive elements.

Catalysts for the condensation cure silicone system catalysts can be selected to minimize generation of species requiring removal, and/or should not require high-temperature activation to enable curing at relatively low temperatures and/or the use of heat-sensitive substrates. Compositions can employ catalysts that are relatively non-toxic, and that are relatively stable in solution but relatively fast-curing upon drying. Catalysts can be effective in relatively low concentrations, and/or effective under relatively low (or no) moisture conditions. Catalysts that can be employed as a vapor phase can be used. In one embodiment, vapor phase cure of the condensation cure silicone system can be conducted using basic or alkaline catalyzing agents. In an embodiment, superbase catalyzing agents such as described in U.S. Pat. No. 9,688,035 by Swier et. al. can be used. In some embodiments, silicone solid compositions manufactured using a superbase catalyst exhibit enhanced cure rates, improved mechanical strength, and improved thermal stability over similar compositions without the superbase catalyst.

The term "superbase" used herein refers to compounds having a very high basicity, such as lithium diisopropylamide. The term "superbase" also encompasses bases resulting from a mixing of two (or more) bases leading to new basic species possessing inherent new properties. The term "superbase" does not necessarily mean a base that is thermodynamically and/or kinetically stronger than another. Instead, in some embodiments, it means that a basic reagent is created by combining the characteristics of several different bases. The term "superbase" also encompasses any species with a higher absolute proton affinity (APA=245.3 kcal/mole) and intrinsic gas phase basicity (GB=239 kcal/mole) relative to 1,8-bis-(dimethylamino)-naphthalene.

Non-limiting examples of superbases include organic superbases, organometallic superbases, and inorganic superbases. Organic superbases include but are not limited to nitrogen-containing compounds. In some embodiments, the nitrogen-containing compounds also have low nucleophilicity and relatively mild conditions of use. Non-limiting examples of nitrogen-containing compounds include phosphazenes, amidines, guanidines, and multicyclic polyamines. Organic superbases also include compounds where a reactive metal has been exchanged for a hydrogen on a heteroatom, such as oxygen (unstabilized alkoxides) or nitrogen (metal amides such as lithium diisopropylamide). In some embodiments, the superbase catalyst is an amidine compound. In some embodiments, the term "superbase" refers to organic superbases having at least two nitrogen atoms and a pKb of from about 0.5 to about 11, as measured in water. In certain embodiments, the superbase catalyst is an organic superbase, such as any of the organic superbases as described above or known in the art.

All or only a portion of the light emitted by the LEDs may be converted by the wavelength converting material of the phosphor. Unconverted light may be part of the final spectrum of light, though it need not be. Examples of common devices include a blue-emitting LED segment combined with a yellow-emitting phosphor, a blue-emitting LED segment combined with green- and red-emitting phosphors, a UV-emitting LED segment combined with blue- and yellow-emitting phosphors, and a UV-emitting LED segment combined with blue-, green-, and red-emitting phosphors. In some embodiments, individually controllable RGB (three LEDs) or RGBY (four LEDs) can be positioned under a single micro-optic. This allows for precise color control of emitted light. Typically, such RGB LEDs are spaced sufficiently far apart that color mixing will occur in the far field.

Direction, beam width, and beam shape of light emitted from each LED can be modified by micro-optics. Micro-optics can be a single optical element or a multiple optic elements. Optical elements can include converging or diverging lenses, aspherical lens, Fresnel lens, or graded index lens, for example. Other optical elements such as mirrors, beam diffusers, filters, masks, apertures, collimators, or light waveguides are also included. Micro-optics can be positioned at a distance from the LEDs that allows receipt and redirection of light from multiple LEDs. Alternatively, micro-optics can be set atop each LED to individually guide, focus, or defocus emitted LED light. Micro-optics can be directly attached to the LEDs, attached to LEDs via a transparent interposer or plate, or held at a fixed distance from LEDs by surrounding substrate attachments (not shown).

In some embodiments, each LED pixel in the light emitter array can be separately controlled, while in other embodiments groups of pixels can be controlled as a block. In still other embodiments, both single pixels and groups of pixels can be controlled. To reduce overall data management requirements, control can be limited to on/off functionality or switching between relatively few light intensity levels. In other embodiments, continuous changes in lighting intensity are supported. Both individual and group level control of light intensity is contemplated. In one embodiment, overlapping or dynamically selected zones of control are also possible, with for example, overlapping groups of light emitters in the pixel array being separately controllable despite having common pixels depending on lighting requirements. In one embodiment, intensity can be separately controlled and adjusted by setting appropriate ramp times and pulse width for each pixel using a pulse width modulation. This allows staging of pixel activation to reduce power fluctuations, and to provide superior luminous intensity control.

Programmable light emitting arrays such as disclosed herein may also support a wide range of applications that benefit from fine-grained intensity, spatial, and temporal control of light distribution. This may include, but is not limited to, precise spatial patterning of emitted light from blocks or individual LEDs. Depending on the application, emitted light may be spectrally distinct, adaptive over time, and/or environmentally responsive. In some embodiments, the light emitting arrays may provide pre-programmed light distribution in various intensity, spatial, or temporal patterns. The emitted light may be based at least in part on received sensor data and may be used for optical wireless communications. Associated optics may be distinct at single or multiple LED level. An example light emitting array may include a device having a commonly controlled central block of high intensity LEDS with an associated common optic, whereas edge positioned LEDs may have individual optics. Common applications supported by light emitting LED arrays include camera or video lighting, architectural and area illumination, and street lighting.

Programmable light emitting arrays may be used to selectively and adaptively illuminate buildings or areas for improved visual display or to reduce lighting costs. In addition, light emitting arrays may be used to project media facades for decorative motion or video effects. In conjunction with tracking sensors and/or cameras, selective illumination of areas around pedestrians may be possible. Spectrally distinct LEDs may be used to adjust the color temperature of lighting, as well as support wavelength specific horticultural illumination.

Street lighting is an important application that may greatly benefit from use of programmable light emitting arrays. A single type of light emitting array may be used to mimic various street light types, allowing, for example, switching between a Type I linear street light and a Type IV semicircular street light by appropriate activation or deactivation of selected LEDs. In addition, street lighting costs may be lowered by adjusting light beam intensity or distribution according to environmental conditions or time of use. For example, light intensity and area of distribution may be reduced when pedestrians are not present. If LEDs are spectrally distinct, the color temperature of the light may be adjusted according to respective daylight, twilight, or night conditions.

Programmable light emitting LEDs are also well suited for supporting applications requiring direct or projected displays. For example, automotive headlights requiring calibration, or warning, emergency, or informational signs may all be displayed or projected using light emitting arrays. This allows, for example, modifying directionality of light output from a automotive headlight. If a light emitting array is composed of a large number of LEDs or includes a suitable dynamic light mask, textual or numerical information may be presented with user guided placement. Directional arrows or similar indicators may also be provided.

Figure 6A:
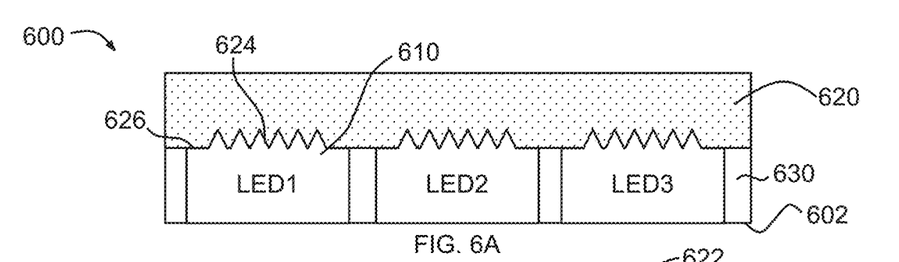
FIGS. 6A-6K illustrate a self-aligned process suitable for surface treatment of pixels.
Figure 6B:
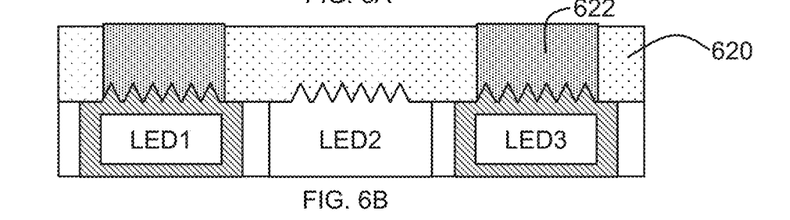
Figure 6C:
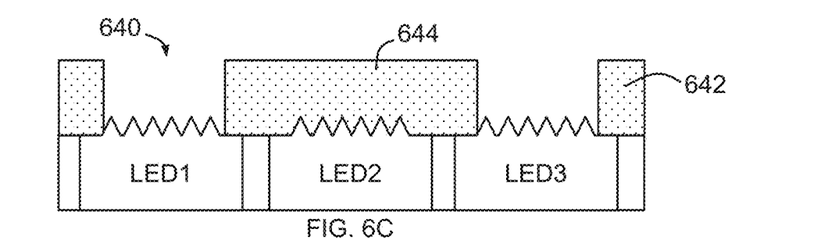
Figure 6D:
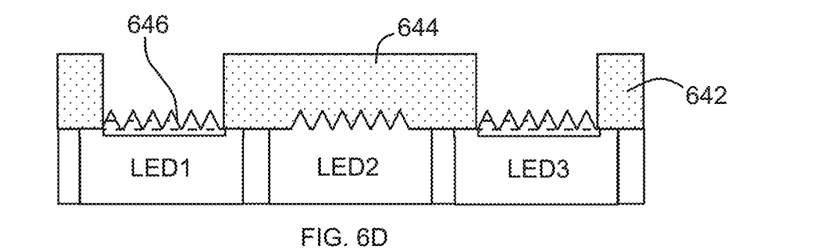
Figure 6E:
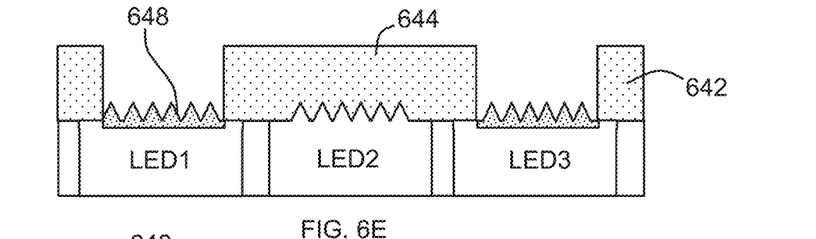
Figure 6F:
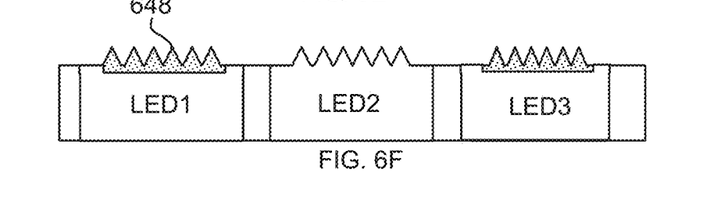

Turning to FIGS. 6A-6K, a self-aligned process 600 according to an embodiment is suitable for surface treatment of pixels. FIG. 6A shows a die or wafer 602 including semiconductor layer 610 that is divided into a plurality of individual pixels each having a central patterned surface 624 and an unpatterned border 626 and being separated by light blocking metal 630. A layer of positive photoresist 620 is deposited onto top surfaces of the die or wafer 602, above the patterned surfaces 624, the unpatterned borders 626, and the light blocking metal 630. All or some pixels (LED1, LED2, and LED3) are illuminated. For illustration purposes here, FIG. 6B shows that LED1 and LED3 are illuminated, which develops positive photoresist into developed positive photoresist 622 above only the patterned surfaces of each illuminated pixel. Positive (undeveloped) photoresist 620 resides on the unpatterned borders, LED2 which was not illuminated, and the light blocking metal. Thereafter in FIG. 6C, the developed positive photoresist 622 portions (i.e. those exposed to light from patterned surfaces of the lit pixels) are washed away. This leaves a cavity 640 separated by a thin edge wall 642 or thick edge wall 644. FIG. 6D illustrates that surface treatment of the exposed LEDs occurs, e.g., chemical etch of exposed GaN surfaces to form porosity 646. FIG. 6E illustrates that small down-converter particles, such as quantum dots (QD), are infused into the treated surfaces. In this way, a "phosphor pixel" 648 embedded in the surface of the GaN is created (for a specific set of colors/pixels/designs). Thereafter, at FIG. 6F, the walls 642 and 644 of remaining positive photoresist are removed. In an embodiment, for a specific set of colors/pixels/designs the surface treatment and down-converter particles are present material on the central pattered surface, and there is an absence of the same on at least portions of the unpatterned border.

Figure 6G:
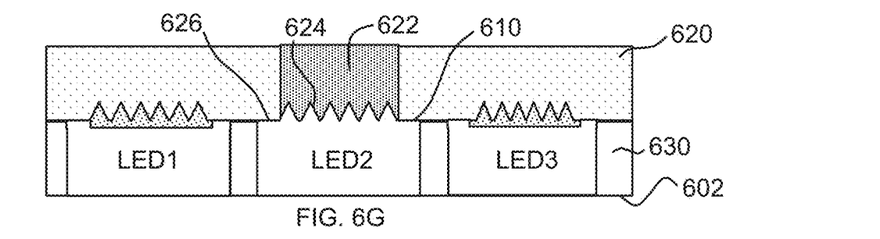
Figure 6H:
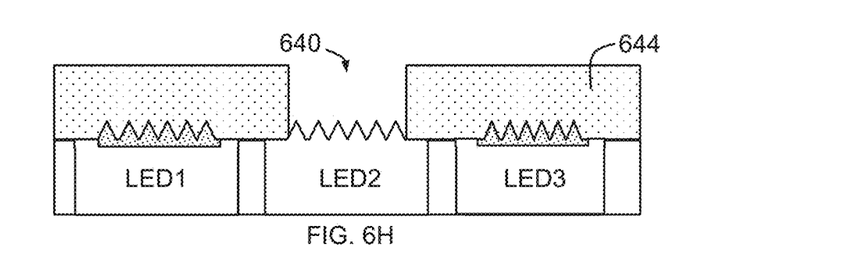
Figure 6I:
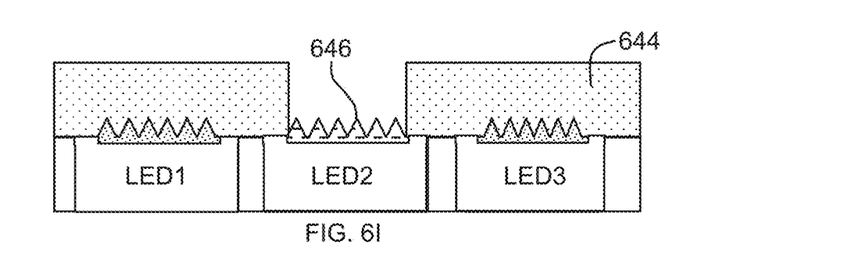
Figure 6J:
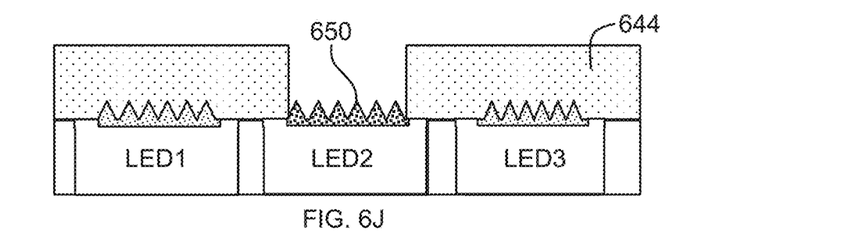
Figure 6K:
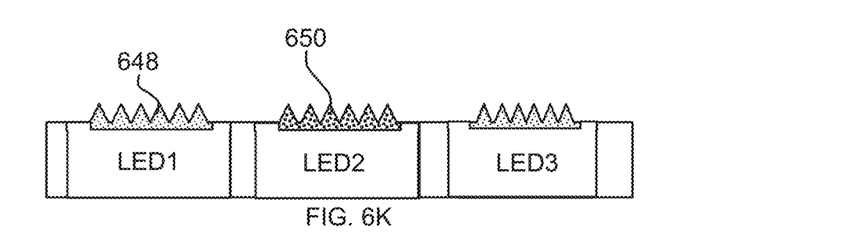

The process can optionally can be repeated for a different set of pixels/colors/designs. Another layer of positive photoresist 620 is deposited onto the substrate. With respect to FIG. 6G, a different set of pixels relative to FIG. 6B is illuminated. For illustration purposes here, LED2 is illuminated, which develops positive photoresist into developed positive photoresist 622 above only the patterned surfaces 624 of LED2, e.g., each illuminated pixel. Positive (undeveloped) photoresist 620 resides on the unpatterned borders 626, the light blocking metal 630, and the unilluminated LEDs: LED1 and LED3. Thereafter at FIG. 6H, the developed positive photoresist portion (i.e. those exposed to light from patterned surfaces of the lit pixels) is washed away. This leaves a cavity 640 separated by thick edge walls 644. At FIG. 6I, surface treatment of the exposed LED occurs, e.g., chemical etch of exposed GaN surface to form porosity 646. At FIG. 6J, small down-converter particles, such as quantum dots (QD), are infused into the treated surfaces. In this way, a "phosphor pixel" 650 embedded in the surface of the GaN is created for another specific set of colors/pixels/designs. Thereafter, shown in FIG. 6K, the walls 644 of remaining positive photoresist are removed. In an embodiment, for a another specific set of colors/pixels/designs the surface treatment and down-converter particles are present material on the central pattered surface, and there is an absence of the same on at least portions of the unpatterned border.

EMBODIMENTS

Various embodiments are listed below. It will be understood that the embodiments listed below may be combined with all aspects and other embodiments in accordance with the scope of the invention.

Embodiment (a). A light source, comprising: an array comprising: a plurality of light emitters, each light emitter comprising: a semiconductor layer having a first surface and a second surface, the first surfaces of at least a portion of the light emitters comprising: a central patterned surface and an unpatterned border, and a down-converter material on the semiconductor layer; and a light blocking metal layer positioned between each of the light emitters.

Embodiment (b). The light source of embodiment (a), wherein the unpatterned border has a width in a range of 1 to 50 microns.

Embodiment (c). The light source of any one of embodiments (a) to (b), wherein there is a presence of the down-converter material on the central pattered surface, and an absence of the down-converter material on at least portions of the unpatterned border.

Embodiment (d). The light source of any one of embodiments (a) to (c), wherein each of the light emitters comprises a minimum width in a range of 5 microns to 500 microns.

Embodiment (e). The light source of any one of embodiments (a) to (d), wherein the semiconductor layer comprises GaN.

Embodiment (f). The light source of any one of embodiments (a) to (e), wherein the down-converter material comprises a phosphor material.

Embodiment (g). The light source of any one of embodiments (a) to (f), wherein the light blocking metal layer has a height of less than 5 microns.

Embodiment (h). The light source of any one of embodiments (a) to (g), wherein the array provides multicolor lighting with phosphors formed from particles bound together by a condensation cure silicone system.

Embodiment (i). The light source of any one of embodiments (a) to (h), wherein the plurality of light emitters is color tunable.

Embodiment (j). The light source of any one of embodiments (a) to (i), further comprising optical elements that are aligned with at least some of the light emitters.

Embodiment (k). The light source of any one of embodiments (a) to (j), wherein the light source is used for at least one of architectural, camera flash, and automotive lighting.

Embodiment (l). The light source of any one of embodiments (a) to (k), wherein the array includes common electrical contacts active at wafer or die level.

Embodiment (m). A method of manufacturing a light source by a self-aligned maskless method comprising: coating an array of light emitters with a positive photoresist; activating at least some of the light emitters to expose portions of the positive photoresist and create developed positive photoresist, each light emitter comprising: a semiconductor layer having a first surface and a second surface, the first surfaces of at least a portion of the light emitters comprising: a central patterned surface and an unpatterned border; washing away the developed positive photoresist to leave cavities having positive photoresist sidewalls; and at least partially filling the cavities with a down-converter material.

Embodiment (n). The method of embodiment (m), wherein the unpatterned border has a width in a range of 1 to 50 microns.

Embodiment (o). The method of any one of embodiments (m) to (n), wherein each of the light emitters comprises a minimum width in a range of 5 microns to 500 microns.

Embodiment (p). The method of any one of embodiments (m) to (o), wherein the semiconductor layer of each of the light emitters comprises GaN.

Embodiment (q). The method of any one of embodiments (m) to (p), wherein the down-converter material comprises a phosphor material.

Embodiment (r). The method of any one of embodiments (m) to (q), further comprising depositing a light blocking metal layer having a height of less than 5 microns between each of the light emitters.

Embodiment (s). The method of any one of embodiments (m) to (r), further comprising depositing and washing away a second positive photoresist layer.

Embodiment (t). The method of any one of embodiments (m) to (s), further comprising an electroplating metal on a bonding metal layer deposited in GaN trenches.

Embodiment (u). The method of any one of embodiments (m) to (t), further comprising providing electrical contacts on a reverse side of a wafer supporting the array of light emitters.

Embodiment (v). The method of any one of embodiments (m) to (u), further comprising activating each of the array of light emitters.

Embodiment (w). The method of any one of embodiments (m) to (v), further comprising activating selected light emitters to define a desired pattern.

Embodiment (x). The method of any one of embodiments (m) to (w), further comprising aligning optical elements with at least some of the array of light emitters.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

What is claimed is:

1. A light source, comprising:
   an array comprising:
      a plurality of light emitters, each light emitter comprising:
         a semiconductor layer having a first surface and a second surface,
         the first surfaces of at least a portion of the light emitters comprising:
            a central patterned surface and an unpatterned border having a width in a range of 1 to 50 microns, and
         a down-converter material on the semiconductor layer; and
      a light blocking metal layer positioned between each of the light emitters.

2. The light source of claim 1, wherein there is a presence of the down-converter material on the central pattered surface, and an absence of the down-converter material on at least portions of the unpatterned border.

3. The light source of claim 1, wherein each of the light emitters comprises a minimum width in a range of 5 microns to 500 microns.

4. The light source of claim 1, wherein the semiconductor layer comprises GaN and the down-converter material comprises a phosphor material.

5. The light source of claim 1, wherein the light blocking metal layer has a height of less than 5 microns.

6. The light source of claim 1, wherein the array provides multicolor lighting with phosphors formed from particles bound together by a condensation cure silicone system.

7. The light source of claim 1, wherein the plurality of light emitters is color tunable.

8. The light source of claim 1, further comprising optical elements that are aligned with at least some of the light emitters.

9. The light source of claim 1, wherein the light source is used for at least one of architectural, camera flash, and automotive lighting.

10. A method of manufacturing a light source by a self-aligned maskless method comprising:
   coating an array of light emitters with a positive photoresist;
   activating at least some of the light emitters to expose portions of the positive photoresist and create developed positive photoresist, each light emitter comprising: a semiconductor layer having a first surface and a second surface, the first surfaces of at least a portion of the light emitters comprising: a central patterned surface and an unpatterned border having a width in a range of 1 to 50 microns;
   washing away the developed positive photoresist to leave cavities having positive photoresist sidewalls; and
   at least partially filling the cavities with a down-converter material.

11. The method of claim 10, wherein each of the light emitters comprises a minimum width in a range of 5 microns to 500 microns.

12. The method of claim 10, wherein the semiconductor layer each of the light emitters comprises GaN.

13. The method of claim 10, further comprising depositing a light blocking metal layer having a height of less than 5 microns between each of the light emitters.

14. The method of claim 10, further comprising depositing and washing away a second positive photoresist layer.

15. The method of claim 10, further comprising providing electrical contacts on a reverse side of a wafer supporting the array of light emitters.

16. The method of claim 10, further comprising activating each of the array of light emitters.

17. The method of claim 10, further comprising activating selected light emitters to define a desired pattern.

18. The method of claim 10, further comprising aligning optical elements with at least some of the array of light emitters.

* * * * *